(12) United States Patent
Kobayashi

(10) Patent No.: US 7,910,898 B2
(45) Date of Patent: Mar. 22, 2011

(54) METHOD AND APPARATUS OF MEASURING BEAM CURRENT WAVEFORMS

(75) Inventor: Tomoaki Kobayashi, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 347 days.

(21) Appl. No.: 12/017,890

(22) Filed: Jan. 22, 2008

(65) Prior Publication Data
US 2008/0173811 A1 Jul. 24, 2008

(30) Foreign Application Priority Data

Jan. 22, 2007 (JP) ................ P.2007-011360

(51) Int. Cl.
G21K 5/10 (2006.01)
(52) U.S. Cl. .............. 250/492.21; 250/492.1; 250/492.3
(58) Field of Classification Search .................. None
See application file for complete search history.

(56) References Cited

U.S. PATENT DOCUMENTS

| | | | | |
|---|---|---|---|---|
| 3,456,318 | A * | 7/1969 | Rabson | 29/888.072 |
| 4,922,106 | A * | 5/1990 | Berrian et al. | 250/492.2 |
| 4,931,635 | A * | 6/1990 | Toyama | 250/225 |
| 4,980,562 | A * | 12/1990 | Berrian et al. | 250/492.2 |
| 5,068,539 | A * | 11/1991 | Nogami et al. | 250/492.2 |
| 5,386,115 | A * | 1/1995 | Freidhoff et al. | 250/281 |
| 6,593,152 | B2 * | 7/2003 | Nakasuji et al. | 438/14 |
| 6,798,723 | B2 * | 9/2004 | Hayashi et al. | 369/44.23 |
| 7,247,848 | B2 * | 7/2007 | Nakasuji et al. | 250/306 |
| 7,456,402 | B2 * | 11/2008 | Parker et al. | 250/310 |
| 2002/0181343 | A1 * | 12/2002 | Hayashi et al. | 369/44.23 |
| 2006/0169899 | A1 * | 8/2006 | Parker et al. | 250/310 |
| 2006/0284114 | A1 * | 12/2006 | Olson et al. | 250/492.21 |
| 2007/0165208 | A1 * | 7/2007 | Cowburn et al. | 356/71 |

FOREIGN PATENT DOCUMENTS

JP 3456318 8/2003

OTHER PUBLICATIONS

Patent Abstracts of Japan for Japanese Publication No. 09-055179, Publication date Feb. 25, 1997 (1 page).

* cited by examiner

*Primary Examiner* — Bernard E Souw
*Assistant Examiner* — Andrew Smyth
(74) *Attorney, Agent, or Firm* — Osha • Liang LLP

(57) ABSTRACT

Beam detectors configuring a beam monitor are connected to a single current measurement apparatus through respective switches. If a width of a beam incident hole of each of the beam detectors 32 in the X direction is Wf, a gap between the beam incident holes of adjacent beam detectors in the X direction is Ws, a beam width of the ion beam in the X direction is Wb, a total number of beam detectors is "p", and "n" is an integer of $0 \leq n \leq (p-2)$ and satisfying $Wb < \{n \cdot Wf + (n+1)Ws\}$, a measuring process of receiving the ion beam by the beam monitor and measuring the waveforms of the beam currents flowing into the current measurement apparatus in a state in which the plurality of switches skipped by "n" are simultaneously switched ON and a switching process of switching the switches simultaneously switched ON under the condition, are repeated.

4 Claims, 8 Drawing Sheets

METHOD AND APPARATUS OF MEASURING BEAM CURRENT WAVEFORMS

The present invention claims priority from Japanese Patent Application No. 2007-011360 filed on Jan 22, 2007, the entire content of which is incorporated herein by reference.

BACKGROUND OF INVENTION

1. Field of the Invention

The present invention relates to a measurement method and apparatus which are, for example, used in an ion implantation apparatus, for receiving ion beam scanned in an X direction and measuring the waveforms of beam currents flowing into a plurality of beam detectors in a beam monitor in which the plurality of beam detectors are arranged at the same interval in the X direction (for example, a horizontal direction, the same applies to the following).

2. Description of the Related Art

FIG. 1 is a schematic plan view showing an example of an ion implantation apparatus. This ion implantation apparatus includes an ion source 2 for emitting ion beam 4, a mass separator 6 for receiving the ion beam from the ion source 2 and separating and taking out the ion beam 4 with an intended mass from the ion beam 4, an accelerator/decelerator 8 for receiving the ion beam 4 from the mass separator 6 and accelerating or decelerating the ion beam 4, an energy separator 10 for receiving the ion beam 4 from the accelerator/decelerator 8 and separating and taking out the ion beam 4 having intended energy from the ion beam 4, a scanner 12 for receiving the ion beam 4 from the energy separator 10 and scanning the ion beam 4 in the X direction, a beam parallelizer 14 for receiving the ion beam 4 from the scanner 12, bending the ion beam 4, and scanning the ion beam 4 in parallel in the X direction in cooperation with the scanner 12, and a wafer moving apparatus 20 for mechanically reciprocally scanning (reciprocation) a wafer 16 in a Y direction (for example, a vertical direction, the same applies to the following) substantially perpendicular to the X direction in an irradiation region of the ion beam 4 from the beam parallelizer 14.

When the design traveling direction of the ion beam 4 emitted from the beam parallelizer 14 is set to a Z direction, two directions which are substantially perpendicular to each other in a plane substantially perpendicular to the Z direction are the X direction and the Y direction. The ion beam 4 emitted from the beam parallelizer 14 is substantially scanned in parallel with the design traveling direction Z. This is called parallel scanning. The "design traveling direction" is a predetermined traveling direction, that is, an originally traveling direction.

The mass separator 6 is, for example, an electric magnet for mass separation, which separates the mass of the ion beam 4 by a magnetic field. The accelerator/decelerator 8 is, for example, an accelerating/decelerating tube which has a plurality of electrodes and accelerates/decelerates the ion beam 4 by an electrostatic field. The energy separator 10 is, for example, an electric magnet for energy separation, which separates the energy of the ion beam 4 by a magnetic field. The scanner 12 is, for example, a scanning electric magnet for scanning the ion beam 4 by a magnetic field. The beam parallelizer 14 is, for example, an electric magnet for beam parallelization, which parallelizes the ion beam 4 by a magnetic field. The wafer moving apparatus 20 has a holder 18 for holding a wafer 16.

By the above-described configuration, the ion beam 4 with the desired mass and the intended energy is scanned in parallel in the X direction and is irradiated on the wafer 16. The wafer 16 is mechanically reciprocally scanned in the Y direction relative to the ion beam 4 and the ion beam 4 is irradiated onto the entire surface of the wafer 16 so as to implant ions. A method of performing both the electromagnetic scanning of the ion beam 4 and the mechanical scanning of the wafer 16 is called a hybrid scanning method.

In the above-described ion implantation apparatus, for example, for parallelism measurement of the ion beam 4 or shaping of the scanning waveforms of the ion beam 4, it is important to measure the waveforms (that is, a temporal variation) of the ion beam scanned in the X direction at a plurality of positions in the X direction in vicinity of the wafer 16 because of increasing size of the wafer 16 and miniaturization of a semiconductor apparatus formed on a surface of the wafer 16.

Conventionally, the measurement of the waveforms of the beam currents of the ion beam 4 was performed by a measurement method shown in FIG. 2 or 3. In either method, a beam monitor 30 which a plurality (for example, ten to several tens) of beam detectors 32 for receiving the ion beam 4 and detecting the beam currents Ib are arranged at the same interval in the X direction is provided in the vicinity of an upstream or a downstream side of the wafer 16, and the beam monitor 30 receives the ion beam 4 scanned in the X direction as denoted by an arrow B and measures the waveforms of the beam currents flowing into the beam detectors 32. Each of the beam detectors 32 is, for example, a Faraday cup.

In the measurement method shown in FIG. 2, the beam detectors 32 configuring the beam monitor 30 are connected to one currents measurement apparatus 40 through switches S, the switches S are sequentially switched on one by one (that is, selectively). The waveforms of the beam currents Ib flowing into the beam detectors 32 are sequentially measured using the currents measurement apparatus 40. The switching of the switch S is performed between measurement processes. That is, a process is repeated by scanning the ion beam 4 to perform the measurement, switching a switch S and scanning the ion beam 4 to perform the measurement.

An example of the beam currents waveforms measured using the currents measurement apparatus 40 is shown in FIG. 4. The beam currents waveforms similar to (is not necessarily equal to) that shown in FIG. 4 is obtained by each of the beam detectors 32. Since the scan speed of the ion beam 4 is substantially constant, the horizontal width of the beam currents waveforms varies according to a beam width (see a beam width Wb shown in FIG. 6) of the ion beam 4 in the X direction and the height thereof varies according to the beam currents density of the ion beam 4.

In Japanese Patent No. 3456318 (paragraph [0009], FIG. 6), a measurement method using one currents measurement apparatus (beam currents converter) in a beam monitor (multi-point beam monitor) in which n conductors are led out is disclosed and corresponds to the measurement method shown in FIG. 2.

In the measurement method shown in FIG. 3, currents measurement apparatus 40 is respectively connected to the beam detectors 32 configuring the beam monitor 30 and the waveforms of the beam currents Ib flowing into the currents measurement apparatus 40 are simultaneously measured. The beam current waveforms measured using the current measurement apparatus 40 are, for example, equal to that shown in FIG. 4.

In the measurement method shown in FIG. 2, since the number of current measurement apparatus 40 is one, all the beam detectors 32 become equal in measurement precision. However, since the switches S of the beam detectors 32 are sequentially switched on one by one so as to measure the beam current waveforms, the measurement is time-consuming.

Although the switches S are switched at a high speed, since a standby time due to switching delay times of the switches S or a response delay time of the current measurement apparatus 40 is required, there is a speed-up limitation. In addition, the life spans of the switches S may be reduced or reliability of connection may deteriorate.

In the measurement method shown in FIG. 3, the waveforms of the beam current flowing into all the beam detectors 32 can be measured for a short period of time. However, since the current measurement apparatus 40 is respectively provided in the beam detectors 32, it is difficult to equalize the measurement precision of the current measurement apparatus 40. Accordingly, the measurement precision deteriorates. In addition, the number of current measurement apparatus 40 is large.

SUMMARY OF INVENTION

One or more embodiments of the present invention provide a measurement method and apparatus capable of measuring the waveforms of beam currents flowing into a plurality of beam detectors of a beam monitor having the beam detectors using a small number of current measurement apparatus for a short period of time with high precision.

In a measurement method or apparatus of beam current waveforms according to one or more embodiments of the present invention, a plurality of beam detectors configuring a beam monitor are connected to a single current measurement apparatus through respective switches.

A first measurement method according to one or more embodiments of the present invention includes repeating a measuring process of receiving the ion beam by the beam monitor and measuring the waveforms of the beam currents flowing into the current measurement apparatus in a state in which the plurality of switches are simultaneously switched on every n switches satisfying Equation 1, if a width of a beam incident hole of each of the beam detectors in the X direction is Wf, a gap between the beam incident holes of adjacent beam detectors in the X direction is Ws, a beam width of the ion beam in the X direction is Wb, the total number of beam detectors is p, and n is an integer of $0 \leq n \leq (p-2)$, and a switching process of switching the switches, which are simultaneously switched on, under the condition.

$$Wb < \{n \cdot Wf + (n+1)Ws\} \qquad \text{Equation 1}$$

A second measurement method according to one or more embodiments of the present invention includes repeatedly performing a first measuring process of receiving the ion beam by the beam monitor and measuring the waveforms of the beam currents flowing into the current measurement apparatus in a state in which two switches are simultaneously switched on while sequentially shifting the two switches, which are simultaneously switched on, inward one by one from two switches connected to the beam detectors located at both ends of the beam monitor in the X direction; repeatedly performing the first measuring process in a range satisfying Equation 2 or an equation which is mathematically equivalent thereto, if a width of a beam incident hole of each of the beam detectors in the X direction is Wf, a gap between the beam incident holes of adjacent beam detectors in the X direction is Ws, a beam width of the ion beam in the X direction is Wb, the total number of beam detectors is p, and the number of beam detectors interposed between the two beam detectors connected to the two switches, which are simultaneously switched on, is n (n is $0 \leq n \leq (p-2)$); and performing a second measurement process of receiving the ion beam by the beam monitor and measuring the waveforms of the beam currents flowing into the current measurement apparatus in a state in which the remaining switches are switched on one by one, after Equation 2 or the equation which is mathematically equivalent thereto does not become satisfied.

$$Wb < \{n \cdot Wf + (n+1)Ws\} \qquad \text{Equation 2}$$

In another measurement method and apparatus of beam current waveforms according to one or more embodiments of the present invention, beam detectors configuring a beam monitor are alternately grouped to a first group and a second group, the beam detectors of the first group are connected to a first current measurement apparatus through respective switches, and the beam detectors of the second group are connected to a second current measurement apparatus through respective switches.

A third measurement method according to one or more embodiments of the present invention includes repeating a measuring process of receiving the ion beam by the beam monitor and measuring the waveforms of the beam currents flowing into the first and second current measurement apparatus in a state in which the plurality of switches are simultaneously switched on every n switches satisfying Equation 3 or an equation which is mathematically equivalent thereto, with respect to the switches for the beam detectors of the first group, and the plurality of switches are simultaneously switched on every m switches satisfying Equation 4 or an equation which is mathematically equivalent thereto, with respect to the switches for the beam detectors of the second group, if a width of a beam incident hole of each of the beam detectors in the X direction is Wf, a gap between the beam incident holes of adjacent beam detectors in the X direction is Ws, a beam width of the ion beam in the X direction is Wb, the total numbers of beam detectors of the first group and the second group are q and r, and n is an integer of $0 \leq n \leq (q-2)$ and m is an integer, $0 \leq m \leq (r-2)$, and a switching process of switching the switches, which are simultaneously switched on, under the condition, with respect to the switches for the beam detectors of the first group and the switches for the beam detectors of the second group.

$$Wb < \{(2n+1)Wf + 2(n+1)Ws\} \qquad \text{Equation 3}$$

$$Wb < \{(2m+1)Wf + 2(m+1)Ws\} \qquad \text{Equation 4}$$

The measurement apparatus according to the present invention includes a control apparatus for controlling processes corresponding to the above-described processes and storage of the measurement data.

According to a first aspect of the invention, although the plurality of switches are simultaneously switched on, in a range satisfying the condition of Equation 1 or 5, since the waveforms of the beam currents flowing into the plurality of beam detectors connected to the switches in the ON state can be temporally separated in the waveforms of the beam currents flowing into the current measurement apparatus, it is possible to separately measure the waveforms of the beam currents flowing into the beam detectors. Accordingly, it is possible to measure the waveforms of the beam currents flowing into the plurality of beam detectors using one current measurement apparatus at once.

As a result, it is possible to measure the waveforms of the beam currents flowing into the beam detectors of the beam monitor having the plurality of beam detectors using a small number (one) of current measurement apparatus for a short period of time. In addition, since the number of current measurement apparatus is one and all the beam detectors become equal in measurement precision, it is possible to realize measurement with high precision.

According to a second aspect of the invention, although the plurality of switches are simultaneously switched on, in a range satisfying the condition of Equation 2 or 6, since the waveforms of the beam currents flowing into two beam detectors connected to the switches in the ON state can be temporally separated in the waveforms of the beam currents flowing into the current measurement apparatus, it is possible to separately measure the waveforms of the beam currents flowing into the beam detectors. Accordingly, it is possible to measure the waveforms of the beam currents flowing into the two beam detectors using one current measurement apparatus at once.

As a result, it is possible to measure the waveforms of the beam currents flowing into the beam detectors of the beam monitor having the plurality of beam detectors using a small number (one) of current measurement apparatus for a short period of time. In addition, since the number of current measurement apparatus is one and all the beam detectors become equal in measurement precision, it is possible to realize measurement with high precision.

Since the first measurement process is repeated while sequentially shifting two switches, which are simultaneously switched on, from the two switches connected to the beam detectors located at the both ends of the beam monitor inward one by one, a combination of the switching of the switches is simplified and the measurement or the control is simplified.

In the first measurement process, the number of times of measurement of the waveforms of the beam currents by two beam detectors according to the beam width of the ion beam can be maximized.

According to a third aspect of the invention, although the plurality of switches are simultaneously switched on, in a range satisfying the condition of Equation 3, 4, 7 or 8, since the waveforms of the beam currents flowing into two beam detectors connected to the switches in the ON state can be temporally separated in the waveforms of the beam currents flowing into the first or second current measurement apparatus, it is possible to separately measure the waveforms of the beam currents flowing into the beam detectors. Accordingly, it is possible to measure the waveforms of the beam currents flowing into the plurality of beam detectors using the first and second current measurement apparatus at once.

As a result, it is possible to measure the waveforms of the beam currents flowing into the beam detectors of the beam monitor having the plurality of beam detectors using a small number (two) of current measurement apparatus for a short period of time. In addition, since the number of current measurement apparatus is two and matching of the measurement precision is facilitated compared with a plurality of current measurement apparatus, it is possible to realize measurement with high precision.

Since the two current measurement apparatus are used, it is possible to select the beam detectors of the number, which is twice of the first aspect of the invention, at once with the same beam width and to measure the beam current waveforms, compared with. Accordingly, it is possible to shorten a time necessary for the measurement. Since the beam detectors are alternately grouped to the first group and the second group, it is possible to cope with a beam width larger than the first aspect of the invention 4 in a case where the number of beam detectors 32 which are selected at once with respect to one current measurement apparatus is the same.

While the waveforms of the beam currents are measured using the beam detectors of one group and the current measurement apparatus used therein, it is possible to switch the switches for the beam detectors of the other group. In addition, a standby time due to a switching delay time of the switches and response delay times of the current measurement apparatus is shorten the time necessary for the measurement.

Other aspects and advantages of the invention will be apparent from the following description and the appended claims.

DESCRIPTION OF EXEMPLARY EMBODIMENTS

Figure 1:
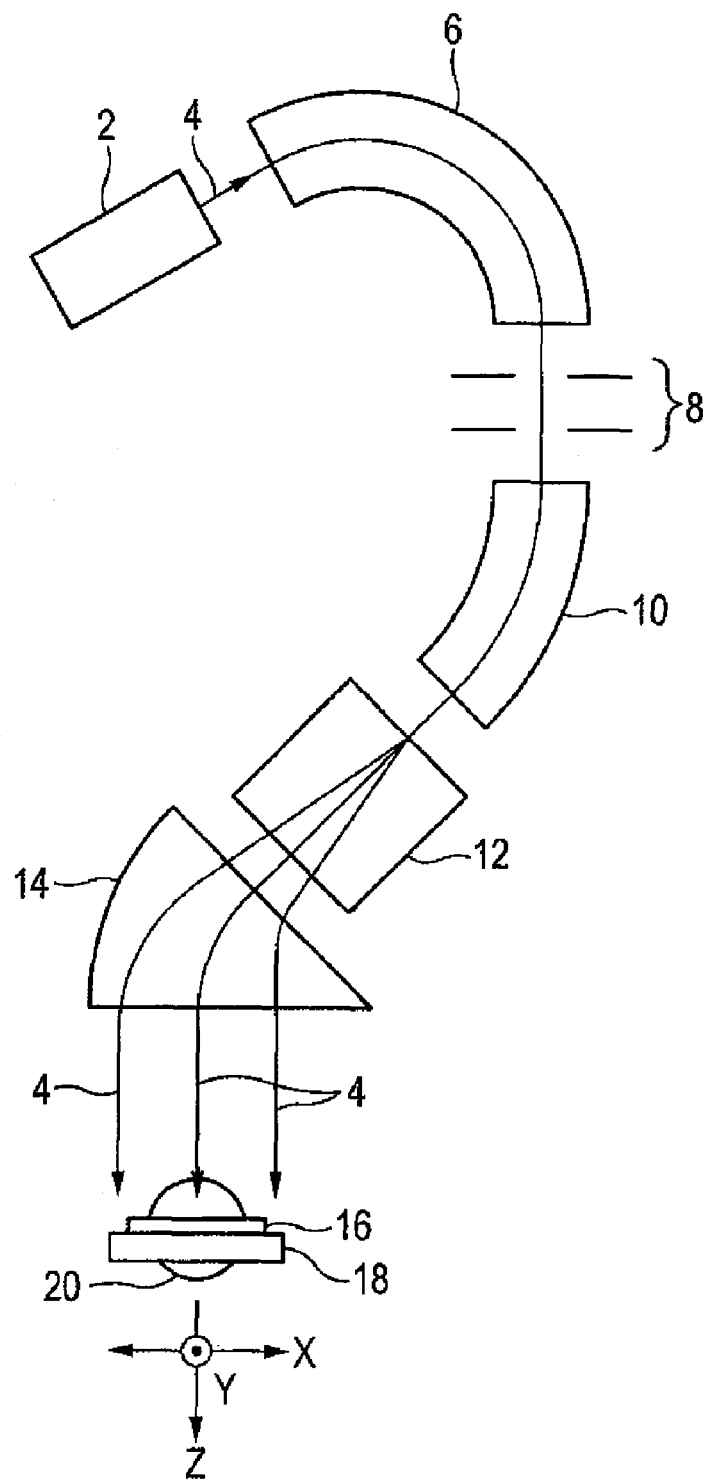
FIG. 1 is a schematic plan view showing an example of an ion implantation apparatus.
Figure 2:
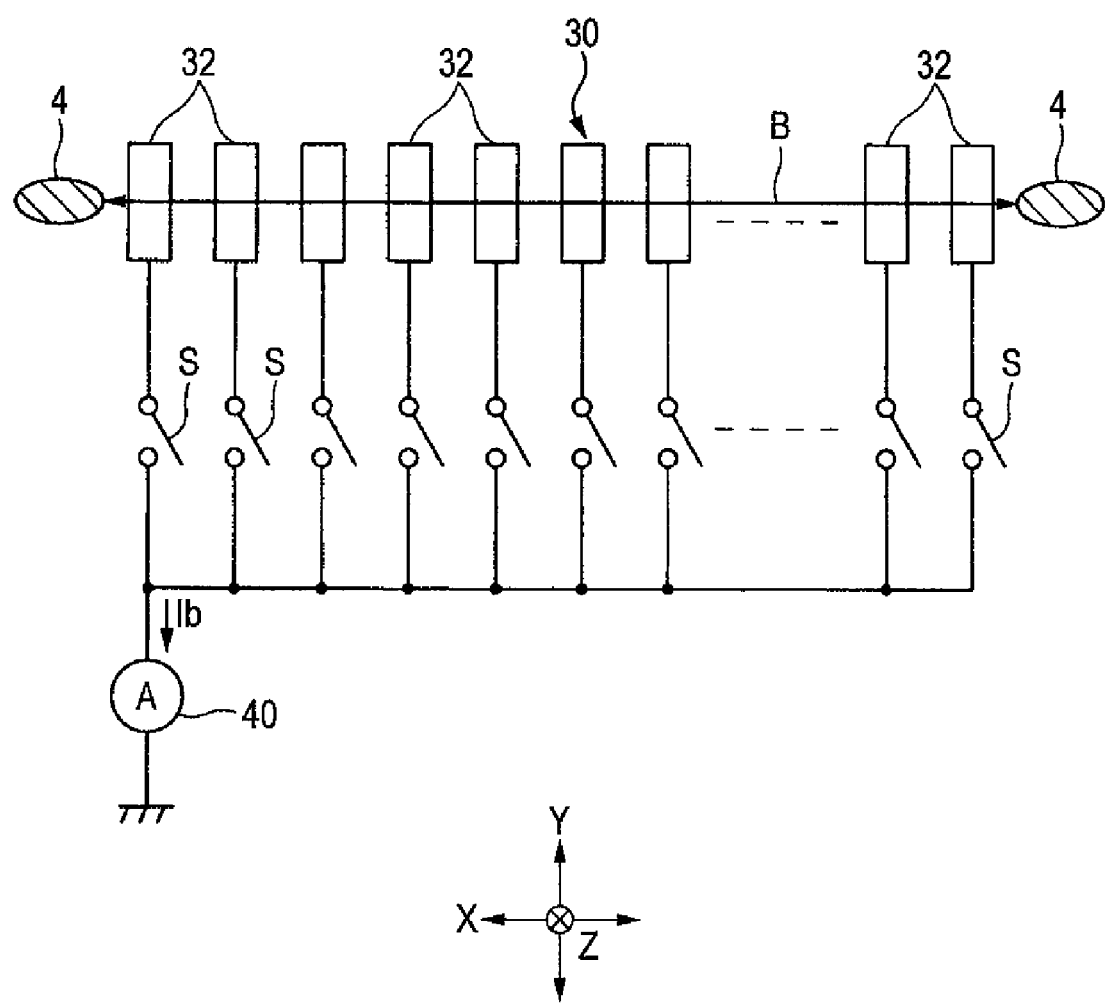
FIG. 2 is a view showing an example of a conventional measurement method of beam current waveforms.
Figure 3:
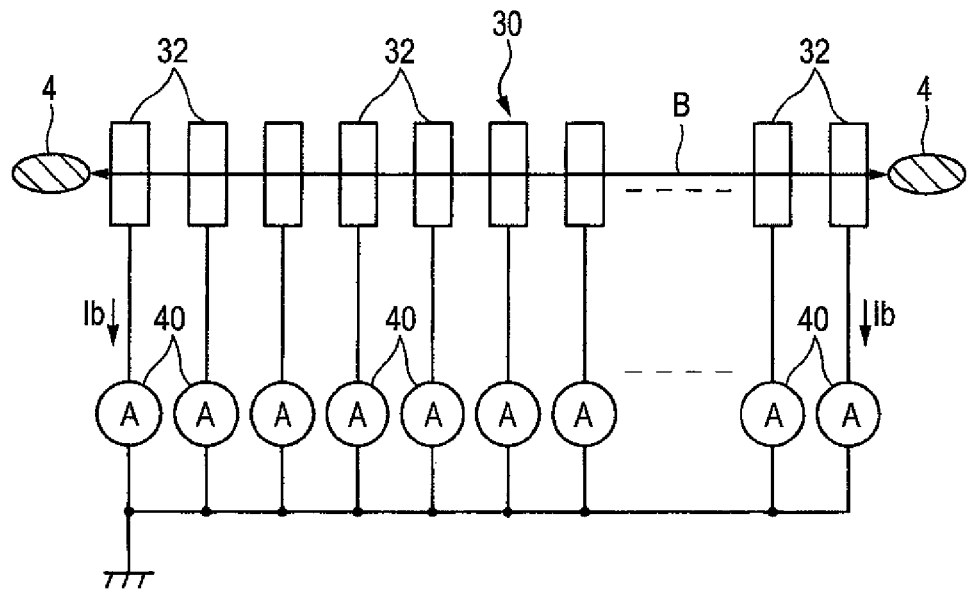
FIG. 3 is a view showing another example of the conventional measurement method of the beam current waveforms.
Figure 3:
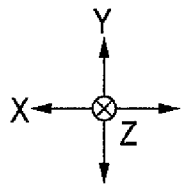
Figure 4:
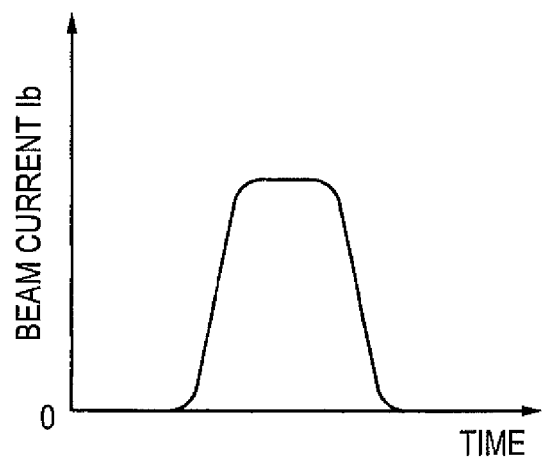
FIG. 4 is a schematic view showing an example of a beam current waveforms.
Figure 5:
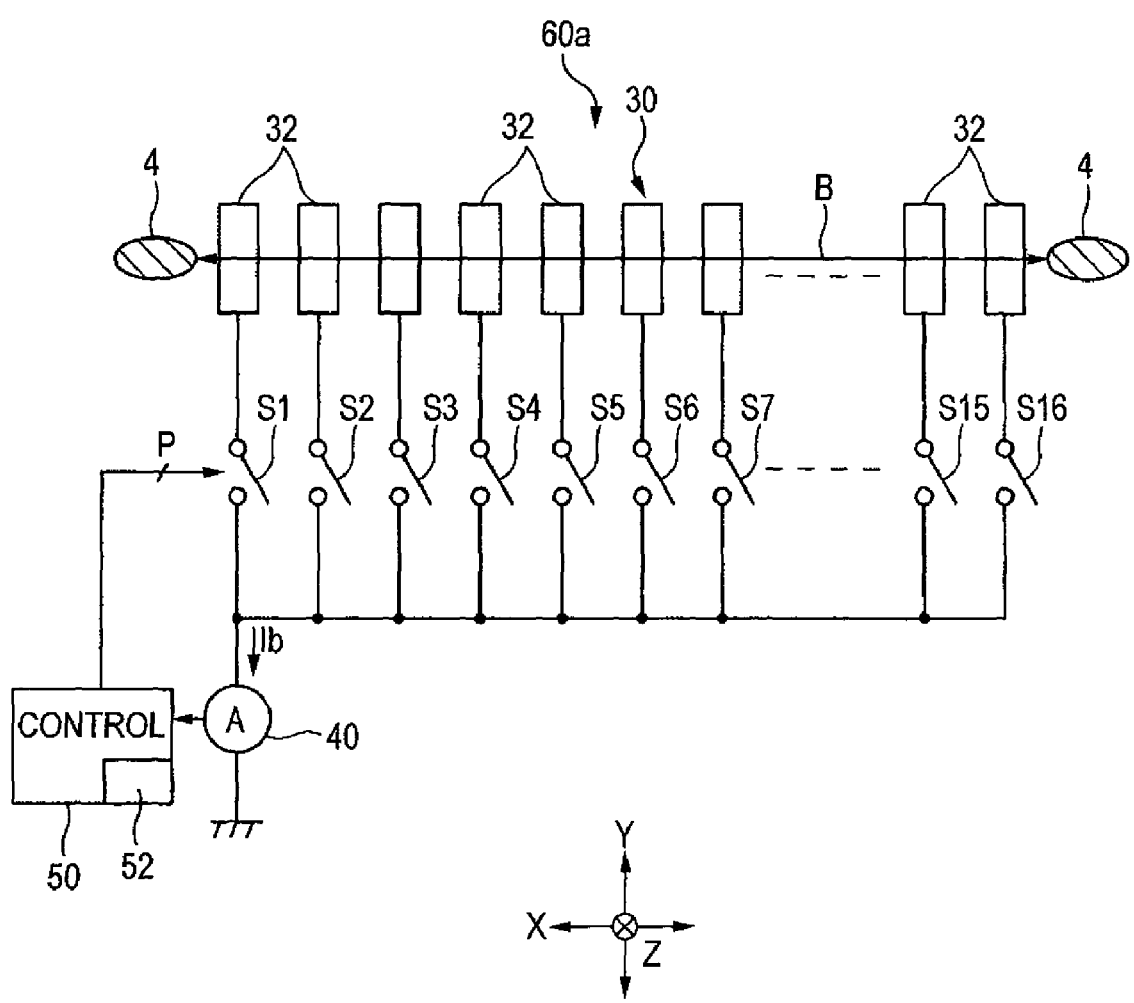
FIG. 5 is a view showing an example of a measurement apparatus for performing a measurement method of beam current waveforms according to the present invention.

FIG. 5 is a view showing an example of a measurement apparatus for performing a measurement method of beam current waveforms according to an exemplary embodiment of the invention. The same or similar portions as the conventional example shown in FIGS. 2 and 3 are designated by like reference numerals and a difference between the conventional example and the embodiment of the invention will be mainly described.

In the following, in order to readily specify a switch S, the total number of beam detectors 32 configuring a beam monitor 30 is set to 16 (that is, p=16) and the switches S respectively connected to the beam detectors 32 are designated by reference numerals S1 to S16 from one end of the X direction. However, the number of the beam detectors is not limited to 16. When the position of the switch is not specified, the switch is only designated by the reference numeral S. The same is true even in a measurement apparatus 60b shown in FIG. 9.

In a measurement apparatus 60a, the beam detectors 32 configuring the beam monitor 30 are connected to one current measurement apparatus 40 through the respective switches S1 to S16. The switches S1 to S16 are, for example, relays. The current measurement apparatus 40 has, for example, a current transducer for transducing currents to a voltage. The same applies to the below-described current measurement apparatus 42.

The measurement apparatus 60a provides a control apparatus 50. In this example, measurement data of beam currents Ib flowing into the current measurement apparatus 40 is input to the control apparatus 50 and is stored in a memory (storage unit) 52 included therein. Alternatively, the memory 52 may be provided outside the control apparatus 50. In FIG. 5, control lines from the control apparatus 50 to the switches S1 to S16 are simplified, but the control lines are respectively connected to the switches S1 to S16. The control apparatus 50 can independently turn on/off the switches S1 to S16. The same applies to measurement apparatus 60b shown in FIG. 9.

A first measurement method for measuring waveforms of beam currents flowing into the beam detectors 32 will be described using the measurement apparatus 60a.

In this measurement method, the beam monitor 30 receives ion beam 4 scanned in an X direction and measures the waveforms of the beam currents Ib flowing into the current measurement apparatus 40, in a state in which a plurality of switches S among the switches S1 to S16 are simultaneously switched on under a predetermined condition (this is called a measurement process).

Figure 6:
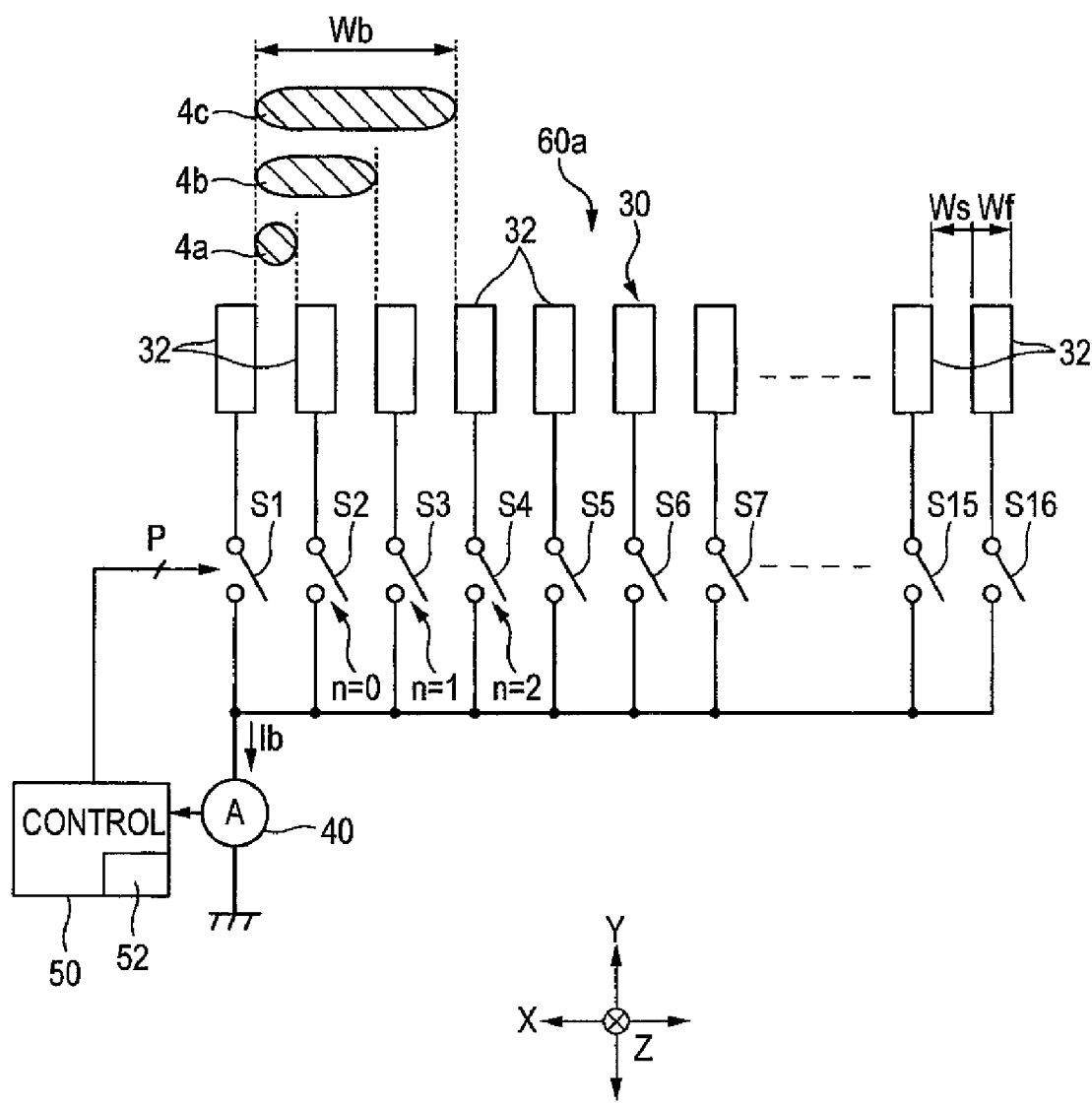
FIG. 6 is a view showing a condition in which a plurality of switches are simultaneously switched on in the measurement apparatus shown in FIG. 5.

The predetermined condition indicates that the plurality of switches S can be simultaneously switched on every n switches satisfying Equation 9 (or Equation equivalent thereto, the same applies to other Equations) if the width of a beam incident hole of each of the beam detectors 32 in the X direction is Wf, an gap between the beam incident holes of adjacent detectors 32 in the X direction is Ws, the beam width of the ion beam 4 in the X direction is Wb, the total number of beam detectors 32 is p, and n is an integer ($0 \leq n \leq (p-2)$) with reference to FIG. 6. This Equation is equal to Equations 1, 2, 5 and 6.

$$Wb < \{n \cdot Wf + (n+1)Ws\} \quad \text{Equation 9}$$

For example, Equation 9 is satisfied at n=0 (that is, skipping by 0) if the beam width Wb of the ion beam 4 is equal to that of ion beam 4a shown in FIG. 6, Equation 9 is first satisfied at n=1 (that is, skipping by 1) if the beam width Wb is equal to that of ion beam 4b, and Equation 9 is first satisfied at n=2 (that is, skipping by 2) if the beam width Wb is equal to that of ion beam 4c. Skipping by 0 indicates that no skipping is done.

Accordingly, for example, a minimum integer n may be selected under the condition that Equation 9 is satisfied. By this configuration, since the plurality of switches S may be simultaneously switched on at a minimum interval, the number of switches S which may be simultaneously switched on, that is, the number of measurement points which may be simultaneously measured, may be maximized.

With respect to the scanned and spread beams, the ion beam 4 which is a scanning source may be called a spot-shaped ion beam 4. The cross-sectional shape of the spot-shaped ion beam 4 is not limited to a specific shape and may be a circle, an elongated circle, an ellipse, a rectangle and other shape.

Figure 7:
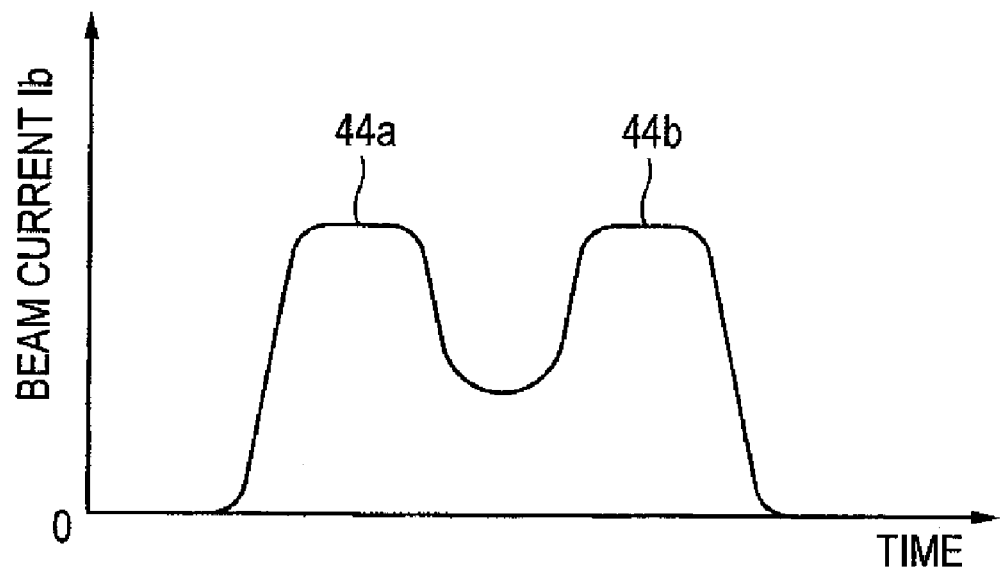
FIG. 7 is a schematic view showing another example of the beam current waveforms.

When the plurality of switches, for example, two switches, are simultaneously switched on, in an integer n which does not satisfy Equation 9 (for example, if n=0 in the ion beam 4b shown in FIG. 6), since the ion beam 4 is not simultaneously made incident to the two beam detectors 32 connected to the two switches S, for example, the waveforms of the beam currents Ib flowing into the current measurement apparatus 40 shown in FIG. 7 is obtained and two waveforms 44a and 44b of the beam currents flowing into the two beam detectors 32 are connected to each other. That is, the beam currents Ib between the waveforms 44a and 44b does not substantially become zero. Here, since a boundary between the beam current waveforms 44a and 44b is obscure, the beam current waveforms 44a and 44b may not be separately measured.

Figure 8:
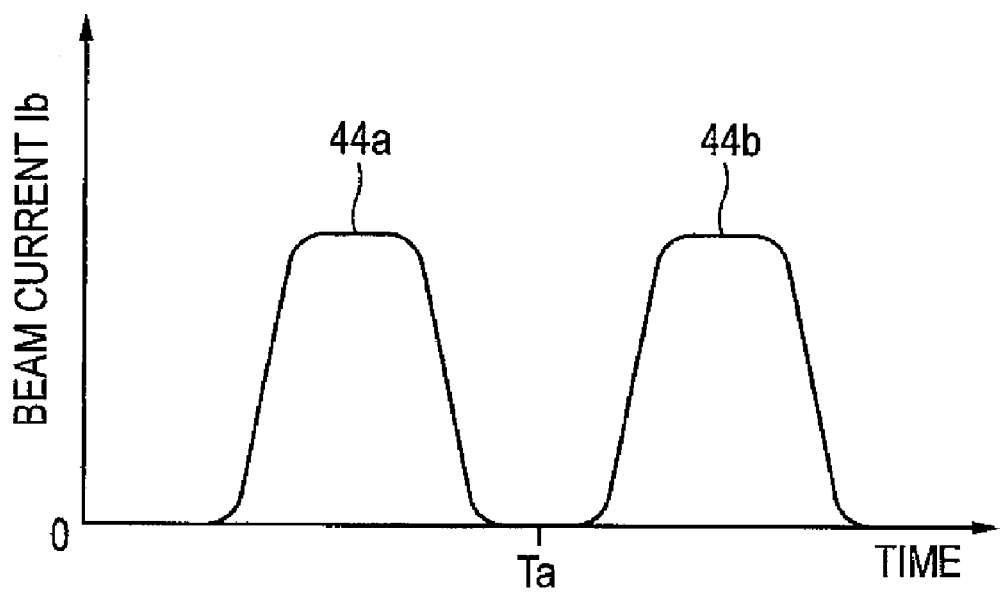
FIG. 8 is a schematic view showing another example of the beam current waveforms.

In contrast, in an integer n satisfying Equation 9, since the ion beam is not simultaneously made incident to two beam detectors 32 connected to two switches S which are switched on, for example, the waveforms of the beam currents Ib flowing into the current measurement apparatus 40 shown in FIG. 8 is obtained and two waveforms 44a and 44b of the beam currents flowing into the two beam detectors 32 are temporally separated from each other. That is, a time period when the beam currents Ib substantially becomes zero exists between the both beam current waveforms 44a and 44b. A gap between the beam current waveforms 44a and 44b depends on a distance between the two beam detectors 32 connected to the switches S which are simultaneously switched on.

Accordingly, the beam current waveforms 44a and 44b may be separately measured. For example, measurement data of the beam currents Ib measured by the current measurement apparatus 40 is separated at a time point when the beam currents Ib is substantially zero or a time point when a peak value of the beam currents Ib is lower than a threshold which is set to several percent. This separation process is, for example, performed by control software in the control apparatus 50.

According to the first measurement method, it is possible to measure the waveforms of the beam currents flowing into the two beam detectors 32 using one current measurement apparatus 40 at once.

The same applies to a case where at least three switches S are simultaneously switched on.

By switching the switches S, which are simultaneously switched on, under the predetermined condition (this is called a switching process), it is possible to measure the waveforms of the beam currents flowing into the plurality of beam detectors 32 using one current measurement apparatus 40 at once, even with respect to the other beam detectors. The switching of the switches S may be, for example, performed during the measurement process. By repeating the measurement process and the switching process, it is possible to measure the waveforms of the beam currents flowing into all the beam detectors 32 configuring the beam monitor 30.

Table 1 shows an example of ON states of the switches S1 to S16 when three switches S are simultaneously switched on at n=5. In this example, it is possible to measure the waveforms of the beam currents flowing into all sixteen beam detectors 32 in a sixth measurement process. If the number of beam detectors 32 is 16, since 16 measurement processes are required in the conventional measurement method shown in FIG. 2, it is possible to significantly reduce the number of measurement processes. As a result, it is possible to perform the measurement for a short period of time (in other words, at a high speed).

TABLE 1

| MEASUREMENT | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| 1st | ○ |  |  |  |  |  | ○ |  |  |  |  |  | ○ |  |  |  |
| 2nd |  | ○ |  |  |  |  |  | ○ |  |  |  |  |  | ○ |  |  |
| 3rd |  |  | ○ |  |  |  |  |  | ○ |  |  |  |  |  | ○ |  |
| 4th |  |  |  | ○ |  |  |  |  |  | ○ |  |  |  |  |  | ○ |
| 5th |  |  |  |  | ○ |  |  |  |  |  | ○ |  |  |  |  |  |
| 6th |  |  |  |  |  | ○ |  |  |  |  |  | ○ |  |  |  |  |

Here, ○ represents the ON state.

According to the first measurement method, since the waveforms of the beam currents flowing into the plurality of beam detectors 32 may be measured at once using one current measurement apparatus 40, it is possible to measure the waveforms of the beam currents flowing into the beam detectors 32 of the beam monitor 30 having the plurality of beam detectors 32 using a small number (one) of current measurement apparatus 40 for a short period of time. In addition, since the number of current measurement apparatus 40 is one and all the beam detectors 32 become equal in measurement precision unlike the case where the current measurement apparatus 40 are respectively provided in the beam detectors 32 in the conventional measurement method shown in FIG. 3, it is possible to realize measurement with high precision.

The control apparatus 50 may control the processes corresponding to the measurement process and the switching process and the storage of the measurement data. That is, the control apparatus 50 may control the repetition of (a) the measurement process of receiving the ion beam 4 by the beam monitor 30, measuring the waveforms of the beam currents Ib flowing into the current measurement apparatus 40 and storing the measurement data in the memory 52 in a state in which the plurality of switches S are switched on under the condition satisfying Equation 9 and (b) the switching process of switching the switches S, which are simultaneously switched on, under the above-described condition.

Accordingly, the measurement apparatus 60a including the control apparatus 50 may have the same effect as the first measurement method.

Next, a second measurement method will be described, concentrating on portions different from that of the first measurement method with reference to Table 2. The configuration of the measurement apparatus 60a is equal to that shown in FIG. 5 excluding the control contents of the control apparatus 50.

In the second measurement method, the first measurement process of receiving the ion beam 4 by the beam monitor 30 and measuring the waveforms of the beam currents Ib flowing into the current measurement apparatus 40 in a state in which two switches S are simultaneously switched on is performed while sequentially shifting two switches S. The switches are simultaneously switched on, inward one by one from two switches S1 and S16 connected to the beam detectors 32 located at the both ends of the beam monitor 30 in the X direction, and a second measurement process of receiving the ion beam 4 by the beam monitor 30 and measuring the waveforms of the beam currents Ib flowing into the current measurement apparatus 40 in a state in which the remaining switches S is switched on one by one is performed after Equation 9 does not become satisfied.

For example, if the beam width Wb of the ion beam 4 is equal to the beam width Wb of the ion beam 4b or 4c shown in FIG. 6, since Equation 9 may be satisfied at $n \geq 2$, the first measurement process may be repeated until seventh measurement processes (in this case, n=2) of Table 2. That is, the number of times of simultaneous measurement at two points (two beam detectors 32) is seven. Thereafter, the second measurement process is performed in a state in which the switch S8 or S9 is switched on one by one.

Even in the second measurement method, since the waveforms of the beam currents flowing into two beam detectors 32 may be measured at once using one current measurement apparatus 40 in a range satisfying Equation 9, it is possible to measure the waveforms of the beam currents flowing into the beam detectors 32 of the beam monitor 30 having the plurality of beam detectors 32 using a small number (one) of current measurement apparatus 40 for a short period of time. In addition, since the number of current measurement apparatus 40 is one and all the beam detectors 32 become equal in measurement precision, it is possible to realize measurement with high precision.

Since the first measurement process is repeated while sequentially shifting two switches S, which are simultaneously switched on, from the two switches S1 and S16 connected to the beam detectors 32 located at the both ends of the beam monitor 30 inward one by one, a combination of the switching of the switches is simplified and the measurement or the control is simplified.

TABLE 2

| MEASUREMENT | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| 1st | ○ |  |  |  |  |  |  |  |  |  |  |  |  |  |  | ○ |
| 2nd |  | ○ |  |  |  |  |  |  |  |  |  |  |  |  | ○ |  |
| 3rd |  |  | ○ |  |  |  |  |  |  |  |  |  |  | ○ |  |  |
| 4th |  |  |  | ○ |  |  |  |  |  |  |  |  | ○ |  |  |  |
| 5th |  |  |  |  | ○ |  |  |  |  |  |  | ○ |  |  |  |  |
| 6th |  |  |  |  |  | ○ |  |  |  |  | ○ |  |  |  |  |  |
| 7th |  |  |  |  |  |  | ○ |  |  | ○ |  |  |  |  |  |  |
| 8th |  |  |  |  |  |  |  | ○ | ○ |  |  |  |  |  |  |  |

Here, ○ represents the ON state.

In the first measurement process, the number of times of simultaneous measurement of the waveforms of the beam currents flowing into two beam detectors 32 may be maximized according to the beam width Wb of the ion beam 4. In more detail, in the first measurement method shown in Table 1, if the beam width Wb of the ion beam 4 is as large as Equation 9 is not satisfied if not n≧6, a combination of the switches S which are simultaneously switched on needs to be changed according to the beam width Wb. In contrast, in the second measurement method shown in Table 2, two-point measurement may be simultaneously performed in the range satisfying Equation 9, whether the beam width Wb of the ion beam 4 is small or large. In addition, the number of times of two-point simultaneous measurement may be maximized according to the beam width Wb. This is because the two-point simultaneous measurement may be performed until the measurement immediately before Equation 9 does not become satisfied, according to the beam width Wb. In order detail, as the beam width Wb is decreased, the number of times of two-point simultaneous measurement is increased.

In the second measurement method shown in Table 2, referring to FIG. 8, since a time point Ta between the two waveforms 44a and 44b included in the waveforms of the beam currents Ib flowing into the current measurement apparatus 40 is substantially a middle portion of one way of the scanning of the ion beam 4, that is, since the following equation 10 is primarily determined if a scan start time point of the ion beam 4 and a scan period is set to Tsc, the measurement data is separated at the time point Ta. Accordingly, the separation process of the measurement data becomes facilitated.

$$Ta \approx Tsc/4 \qquad \text{Equation 10}$$

The control apparatus 50 may control the processes corresponding to the first measurement process and the second measurement process and the storage of the measurement data. That is, the control apparatus 50 may perform (a) the control of the repetition of the first measurement process of receiving the ion beam 4 by the beam monitor 30, measuring the waveforms of the beam currents Ib flowing into the current measurement apparatus 40, storing the measurement data in the memory 52 in the state, in which two switches S are simultaneously switched on, in the range satisfying Equation 9, while sequentially shifting the switches S, which are simultaneously switched on, inward one by one from the two switches S1 and S16 connected to the beam detectors 32 located at the both ends of the beam monitor 30 in the X direction and (b) the control of the second measurement process of receiving the ion beam 4 by the beam monitor 30, measuring the waveforms of the beam currents Ib flowing into the current measurement apparatus 40 and storing the measurement data in the memory in the state in which the remaining switches S are switched on one by one, after Equation 9 does not become satisfied.

The measurement apparatus 60a including the control apparatus 50 may have the same effect as the second measurement method.

Figure 9:
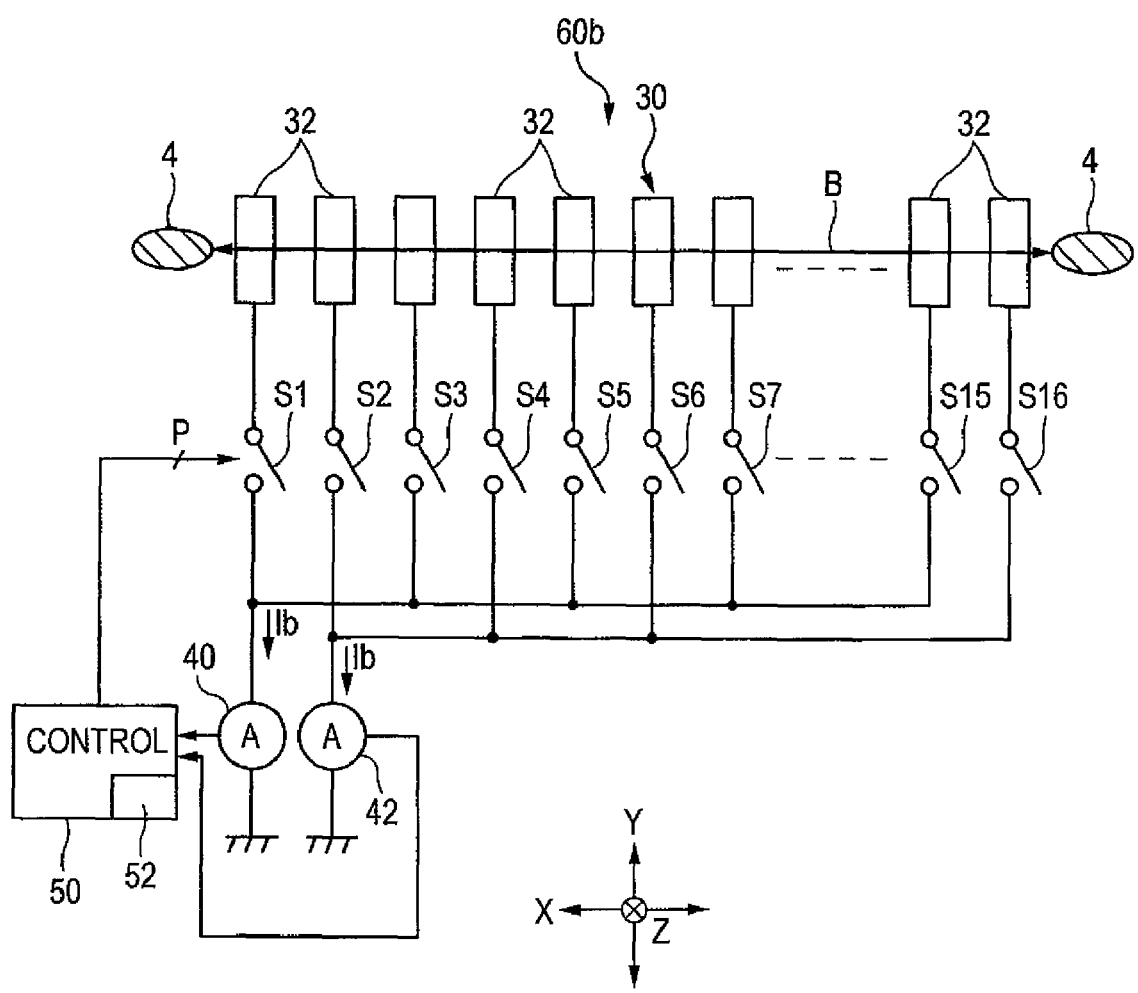
FIG. 9 is a view showing another example of the measurement apparatus for performing the measurement method of the beam current waveforms according to the present invention.

FIG. 9 is a view showing another example of the measurement apparatus for performing the measurement method of the beam current waveforms according to the present invention. Hereinafter, portions different from the first measurement method and the measurement apparatus 60a described in FIG. 5 will be described.

In the measurement apparatus 60b, the plurality of beam detectors 32 configuring the beam monitor 30 are alternately grouped to a first group and a second group such that the beam detectors 32 of the first group are connected to a first current measurement apparatus 40 through the respective switches S (in more detail, S1, S3, . . . , and S15) and the beam detectors 32 of the second group are connected to a second current measurement apparatus 42 through the respective switches S (in more detail, S2, S4, . . . , and S16). The measurement data of the beam currents Ib flowing into the current measurement apparatus 40 and 42 are input to the control apparatus 50 and are stored in the memory 52.

A third measurement method for measuring the waveforms of the beam currents flowing into the beam detectors 32 will be described by the measurement apparatus 60b.

In this measurement apparatus, the plurality of switches S among the switches S for the beam detectors 32 of the first group are simultaneously switched on under a predetermined condition, the plurality of switches S among the switches S for the beam detectors 32 of the second group are simultaneously switched on under the predetermined condition, the ion beam 4 scanned in the X direction are received by the beam monitor 30, and the waveforms of the beam currents Ib flowing into the current measurement apparatus 40 and 42 are measured (this is called a measurement process).

Figure 10:
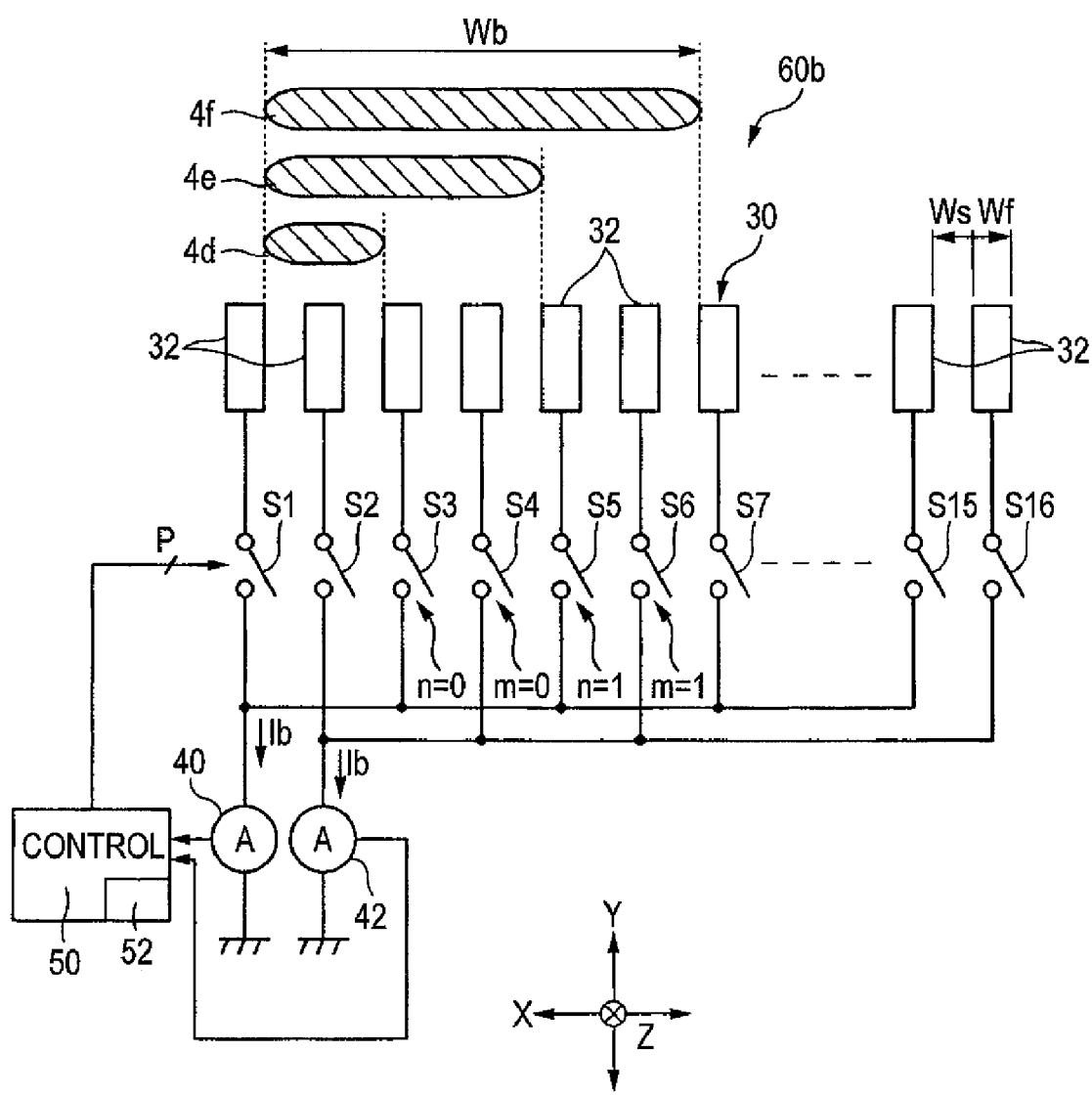
FIG. 10 is a view showing a condition in which a plurality of switches are simultaneously switched on in the measurement apparatus shown in FIG. 9.

The predetermined condition indicates that the plurality of switches S are simultaneously switched on every n switches satisfying Equation 11 with respect to the switches S for the beam detectors 32 of the first group and the plurality of switches S are simultaneously switched on every m switches satisfying Equation 12 with respect to the switches S for the beam detectors 32 of the second group if the beam width of a beam incident hole of each of the beam detectors 32 in the X direction is Wf, an gap between the beam incident holes of adjacent detectors 32 in the X direction is Ws, the beam width of the ion beam 4 in the X direction is Wb, the total numbers of beam detectors 32 of the first group and the second group are q and r, n is an integer ($0 \leq n \leq (q-2)$), and m is an integer of $0 \leq m \leq (r-2)$ with reference to FIG. 10. Equation 11 is equal to Equations 3 and 7 and Equation 12 is equal to Equations 4 and 8. Here, n=m or n≠m may be satisfied. The total number of beam detectors 32 is q+r=p.

$$Wb < \{(2n+1)Wf + 2(n+1)Ws\} \qquad \text{Equation 11}$$

$$Wb < \{(2m+1)Wf + 2(m+1)Ws\} \qquad \text{Equation 12}$$

For example, Equations 11 and 12 are satisfied at n=0 and m=0 if the beam width Wb of the ion beam 4 is equal to that of ion beam 4d shown in FIG. 10, Equations 11 and 12 are first satisfied at n=1 and m=1 if the beam width Wb is equal to that of ion beam 4e, and Equations 11 and 12 are first satisfied at n=2 and m=2 if the beam width Wb is equal to that of ion beam 4f.

Accordingly, for example, minimum integers n and m may be selected under the condition satisfying Equations 11 and 12. By this configuration, since the plurality of switches S may be simultaneously switched on at a minimum interval, the number of switches S which may be simultaneously switched on, that is, the number of measurement points which may be simultaneously measured, may be maximized.

Even in this measurement method, similar to the first measurement method, although the plurality of switches S are simultaneously switched on, since the waveforms of the beam currents flowing into the plurality of beam detectors 32 connected to the switches S in the ON state may be temporally separated in the waveforms of the beam currents Ib flowing into the two current measurement apparatus 40 and 42, it is possible to separately measure the waveforms of the beam currents flowing into the beam detectors 32. Accordingly, it is possible to measure the waveforms of the beam currents flowing into the two beam detectors 32 using the two current measurement apparatus 40 and 42 at once.

In addition, by switching the switches S, which are simultaneously switched on, under the predetermined condition with respect to the switches S for the beam detectors 32 of the first group and the switches S for the beam detectors 32 of the second group (this is called a switching process), it is possible to measure the waveforms of the beam currents flowing into the plurality of beam detectors 32 using the current measurement apparatus 40 and 42 at once, even with respect to other beam detectors 32. The switching of the switches S may be, for example, performed between the measurement processes. By repeating the measurement process and the switching process, it is possible to measure the waveforms of the beam currents flowing into all the beam detectors 32 configuring the beam monitor 30.

According to the third measurement method, since the waveforms of the beam currents flowing into the plurality of beam detectors 32 may be measured at once using the two current measurement apparatus 40 and 42, it is possible to measure the waveforms of the beam currents flowing into the beam detectors 32 of the beam monitor 30 having the plurality of beam detectors 32 using a small number (two) of current measurement apparatus 40 and 42 for a short period of time. In addition, since the number of current measurement apparatus is two and matching of the measurement precision of the two current measurement apparatus 40 and 42 is facilitated compared with the case the plurality of current measurement apparatus are used, for example, the case where the current measurement apparatus 40 are respectively provided in the beam detectors 32 in the conventional measurement method shown in FIG. 3, it is possible to realize measurement with high precision.

Since the two current measurement apparatus 40 and 42 are used, it is possible to select the beam detectors 32 of the number which is twice that of the first measurement method with the same beam width Wb and to measure the beam current waveforms. Accordingly, it is possible to shorten a time necessary for the measurement. Since the beam detectors 32 are alternately grouped to the first group and the second group, it is possible to cope with a beam width Wb larger than (for example, twice) that of the first measurement method in a case where the number of beam detectors 32 which are selected at once with respect to one current measurement apparatus is the same.

While the waveforms of the beam currents are measured using the beam detectors 32 of one group and the current measurement apparatus used therein, it is possible to switch the switches S for the beam detectors of the other group, suppress a standby time due to a switching delay time of the switches S and response delay times of the current measurement apparatus 40 and 42, and further shorten the time necessary for the measurement.

In this example, the control apparatus 50 may control the processes corresponding to the measurement process and the switching process and the storage of the measurement data. That is, the control apparatus 50 may control the repetition of (a) the measurement process of receiving the ion beam 4 by the beam monitor 30, measuring the wave forms of the beam currents Ib flowing into the current measurement apparatus 40 and 42 and storing the measurement data in the memory 52 in a state in which the plurality of switches S for the beam detectors 32 of the first group are simultaneously switched on every n switches satisfying Equation 11 and the plurality of switches S for the beam detectors 32 of the second group are simultaneously switched on every m switches satisfying Equation 12 and (b) the switching process of switching the switches S, which are simultaneously switched on, of the switches S for the beam detectors 32 of the first group and the switches S for the beam detectors 32 of the second group under the above-described condition.

Accordingly, the measurement apparatus 60b including the control apparatus 50 may have the same effect as the third measurement method.

When the number of current measurement apparatus 40 is large as in the conventional example shown in FIG. 3, it is difficult to compare and check the measurement precision of the current measurement apparatus 40. However, when the number of current measurement apparatus is two as in the measurement apparatus 60b, it is easy to compare and check the measurement precision.

What is claimed is:

1. A method of measuring waveforms of beam currents, for receiving ion beam scanned in an X direction and measuring the waveforms of the beam currents flowing into a plurality of beam detectors by a beam monitor in which the plurality of beam detectors for receiving the ion beam and detecting the beam currents are arranged at constant intervals in the X direction, the method comprising:

connecting the plurality of beam detectors to a single current measurement apparatus through respective switches;

measuring the waveforms of the beam currents flowing into the current measurement apparatus by receiving the ion beam by the beam monitor, under a condition in which a plurality of switches skipped by "n" in the switches are simultaneously switched on, wherein the "n" is an integer of $0 \leq n \leq (p-2)$ and satisfying Equation 1 or an equation mathematically equivalent to the Equation 1, the Equation 1 is $Wb < \{n \cdot Wf + (n+1)Ws\}$, a width of a beam incident hole of each of the beam detectors in the X direction is Wf, a gap between the beam incident holes of adjacent beam detectors in the X direction is Ws, a beam width of the ion beam in the X direction is Wb, a total number of beam detectors is "p";

switching the switches, which are simultaneously switched on, under the condition; and repeating the steps of measuring and switching.

2. A method of measuring waveforms of beam currents, for receiving ion beam scanned in an X direction and measuring the waveforms of the beam currents flowing into a plurality of beam detectors by a beam monitor in which the plurality of beam detectors for receiving the ion beam and detecting the beam currents are arranged at constant intervals in the X direction, the method comprising:

connecting the plurality of beam detectors to a single current measurement apparatus through respective switches;

repeatedly performing a first measuring process of receiving the ion beam by the beam monitor and measuring the waveforms of the beam currents flowing into the current measurement apparatus in a state in which two switches in the switches are simultaneously switched on while sequentially shifting the two switches, which are simultaneously switched on, inward one by one from two switches connected to the beam detectors located at both ends of the beam monitor in the X direction, wherein the first measuring process is performed in a range satisfying Equation 2 or an equation mathematically equivalent to the Equation 2, the Equation 2 is $Wb < \{n \cdot Wf + (n+1)Ws\}$, a width of a beam incident hole of each of the beam detectors in the X direction is Wf, a gap between the beam incident holes of adjacent beam detectors in the X direction is Ws, a beam width of the ion beam in the X direction is Wb, a total number of beam detectors is "p", and the number of beam detectors interposed between the two beam detectors connected to the two switches, which are simultaneously switched on, is "n", and "n" is $0 \leq n \leq (p-2)$; and performing a second measurement process of receiving the ion beam by the beam monitor and measuring the waveforms of the beam currents flowing into the current measurement apparatus in a state in which the remaining switches are switched on one by one, after the Equation 2 or the equation mathematically equivalent thereto does not become satisfied.

3. A method of measuring waveforms of beam currents, for receiving ion beam scanned in an X direction and measuring the waveforms of the beam currents flowing into a plurality of beam detectors by a beam monitor in which the plurality of beam detectors for receiving the ion beam and detecting the beam currents are arranged at constant intervals in the X direction, the method comprising:

alternately grouping the beam detectors to a first group and a second group;

connecting the beam detectors of the first group to a first current measurement apparatus through respective switches, and connecting the beam detectors of the second group to a second current measurement apparatus through respective switches;

measuring the waveforms of the beam currents flowing into the first and second current measurement apparatus by receiving the ion beam by the beam monitor, under a condition in which the plurality of switches skipped by "n" for the beam detectors of the first group are simultaneously switched on, and the plurality of switches skipped by "m" for the beam detectors of the second group are simultaneously switched on, wherein "n" is an integer of $0 \leq n \leq (q-2)$ and satisfying Equation 3 or an equation mathematically equivalent to the Equation 3, "m" is an integer $0 \leq n \leq (r-2)$ and satisfying Equation 4 or an equation mathematically equivalent to the Equation 4, Equation 3 is $Wb < \{(2n+1)Wf + 2(n+1)Ws\}$, Equation 4 is $Wb < \{(2m+1)Wf + 2(m+1)Ws\}$, a width of a beam incident hole of each of the beam detectors in the X direction is Wf, a gap between the beam incident holes of adjacent beam detectors in the X direction is Ws, a beam width of the ion beam in the X direction is Wb, and total numbers of beam detectors of the first group and the second group are "q" and "r";

switching the switches, which are simultaneously switched on, under the condition, with respect to the switches for the beam detectors of the first group and the switches for the beam detectors of the second group; and repeating the steps of measuring and switching.

4. A apparatus of measuring waveforms of beam currents, for receiving ion beam scanned in an X direction and measuring the waveforms of the beam currents flowing into a plurality of beam detectors by a beam monitor in which the plurality of beam detectors for receiving the ion beam and detecting the beam currents are arranged at the same interval in the X direction, wherein the beam detectors are alternately grouped to a first group and a second group, the beam detectors of the first group are connected to a first current measurement apparatus through respective switches, and the beam detectors of the second group are connected to a second current measurement apparatus through respective switches, the apparatus comprising:

a control apparatus for controlling repetition of:

(a) a measuring process of receiving the ion beam by the beam monitor, measuring the waveforms of the beam currents flowing into the first and second current measurement apparatus, and storing measurement data in a memory, in a condition in which the plurality of switches skipped by "n" for the beam detectors of the first group are simultaneously switched on, and the plurality of switches skipped by "m" for the beam detectors of the second group are simultaneously switched on, wherein "n" is an integer of $0 \leq n \leq (q-2)$ and satisfying Equation 7 or an equation mathematically equivalent to the Equation 7, "m" is an integer $0 \leq m \leq (r-2)$ and satisfying Equation 8 or an equation which is mathematically equivalent to the Equation 8, the Equation 7 is $Wb < \{(2n+1)Wf + 2(n+1)Ws\}$, the Equation 8 is $Wb < \{(2m+1)Wf + 2(m+1)Ws\}$, a width of a beam incident hole of each of the beam detectors in the X direction is Wf, a gap between the beam incident holes of adjacent beam detectors in the X direction is Ws, a beam width of the ion beam in the X direction is Wb, and total numbers of beam detectors of the first group and the second group are "q" and "r", and (b) a switching process of switching the switches simultaneously switched on, under the condition, with respect to the switches for the beam detectors of the first group and the switches for the beam detectors of the second group.

* * * * *